(12) United States Patent
Suzuki et al.

(10) Patent No.: US 10,101,404 B2
(45) Date of Patent: Oct. 16, 2018

(54) BATTERY MONITORING DEVICE THAT MONITORS A PLURALITY OF BATTERY CELLS CONNECTED IN SERIES

(71) Applicant: Hitachi Automotive Systems, Ltd., Hitachinaka-shi, Ibaraki (JP)

(72) Inventors: Mutsumi Suzuki, Tokyo (JP); Mutsumi Kikuchi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 27 days.

(21) Appl. No.: 15/302,187

(22) PCT Filed: Apr. 9, 2015

(86) PCT No.: PCT/JP2015/061126
§ 371 (c)(1),
(2) Date: Oct. 6, 2016

(87) PCT Pub. No.: WO2015/156360
PCT Pub. Date: Oct. 15, 2015

(65) Prior Publication Data
US 2017/0030976 A1 Feb. 2, 2017

(30) Foreign Application Priority Data
Apr. 11, 2014 (JP) .................. 2014-081975

(51) Int. Cl.
*G01R 31/36* (2006.01)
(52) U.S. Cl.
CPC ..... *G01R 31/3658* (2013.01); *G01R 31/3624* (2013.01); *G01R 31/3662* (2013.01)

(58) Field of Classification Search
CPC ............ G01R 31/3658; G01R 31/3624; G01R 31/3662
See application file for complete search history.

(56) References Cited

U.S. PATENT DOCUMENTS

| | | | | |
|---|---|---|---|---|
| 6,020,743 A | * | 2/2000 | Reeves ............ | G01R 19/16542 324/433 |
| 2011/0181247 A1 | * | 7/2011 | Park ................. | H01M 10/4264 320/118 |

(Continued)

FOREIGN PATENT DOCUMENTS

| JP | 2005-345124 A | 12/2005 |
|---|---|---|
| JP | 2007-185078 A | 7/2007 |

(Continued)

OTHER PUBLICATIONS

International Search Report (PCT/ISA/210) issued in PCT Application No. PCT/JP2015/061126 dated Jul. 7, 2015 with English translation (Two (2) pages).

(Continued)

*Primary Examiner* — Jermele M Hollington
*Assistant Examiner* — Feba Pothen
(74) *Attorney, Agent, or Firm* — Crowell & Moring LLP

(57) ABSTRACT

A battery monitoring device includes a first voltage measurement unit, a second voltage measurement unit, a current measurement unit, a cell voltage ratio calculation unit, a cell voltage calculation unit, and a trigger signal generation unit. The cell voltage ratio is a ratio of an individual cell voltage measurement value to a total sum of all cell voltage measurement values. The cell voltage measurement value is equal to the cell voltage ratio multiplied by the total voltage of all of the battery cells constituting the battery pack.

9 Claims, 13 Drawing Sheets

(56) References Cited

U.S. PATENT DOCUMENTS

| | | | |
|---|---|---|---|
| 2012/0161708 A1 | 6/2012 | Miura et al. | |
| 2013/0300371 A1* | 11/2013 | Bills | H02J 7/0016 |
| | | | 320/118 |
| 2014/0266229 A1* | 9/2014 | McCoy | G01R 31/3627 |
| | | | 324/434 |

FOREIGN PATENT DOCUMENTS

| | | |
|---|---|---|
| JP | 2011-69782 A | 4/2011 |
| JP | 2012-135140 A | 7/2012 |
| JP | 2012-154641 A | 8/2012 |

OTHER PUBLICATIONS

Japanese-language Written Opinion (PCT/ISA/237) issued in PCT Application No. PCT/JP2015/061126 dated Jul. 7, 2015 (Four (4) pages).

Extended European Search Report issued in counterpart European Application No. 15777200.5 dated Nov. 24, 2017 (seven pages).

Japanese-language Office Action issued in counterpart Japanese Application No. 2014-081975 dated Dec. 26, 2017 with English translation (Six (6) pages).

\* cited by examiner

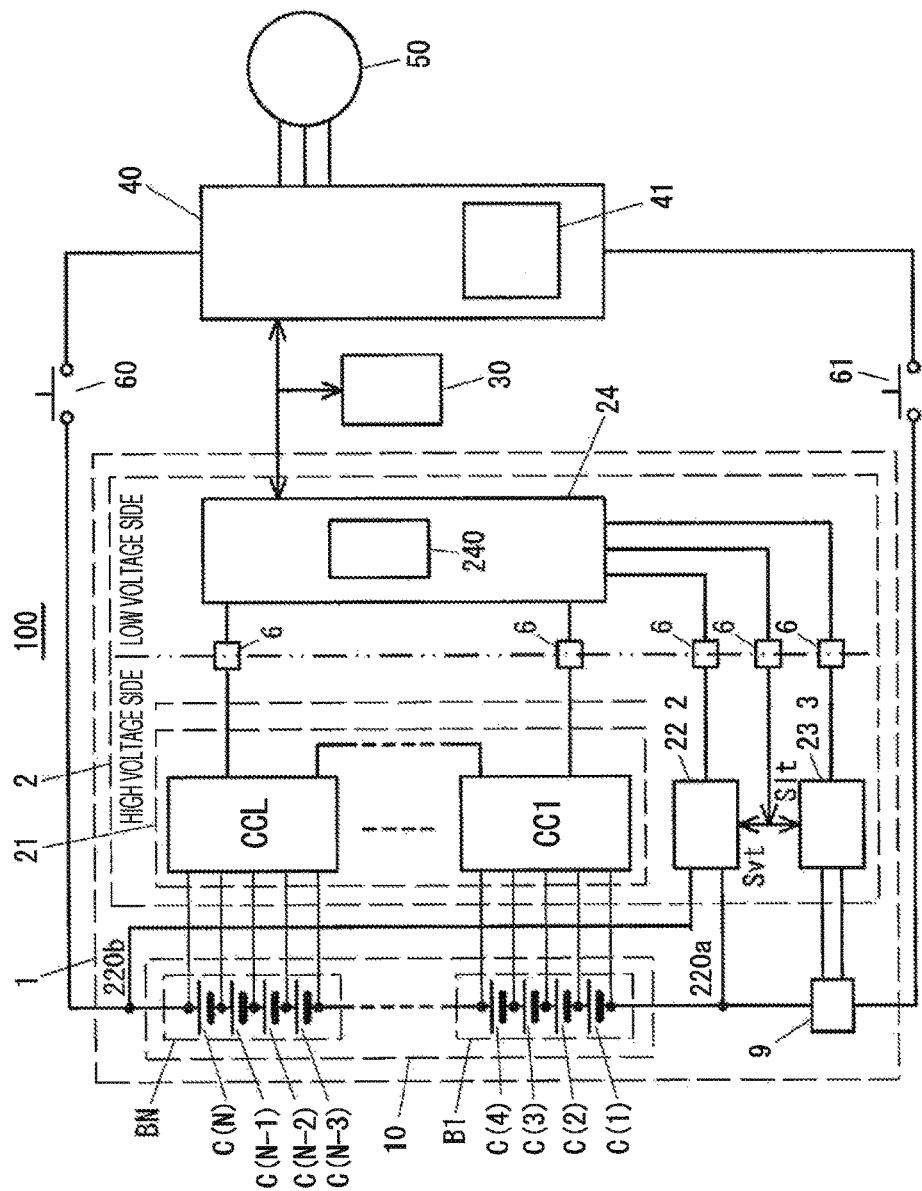

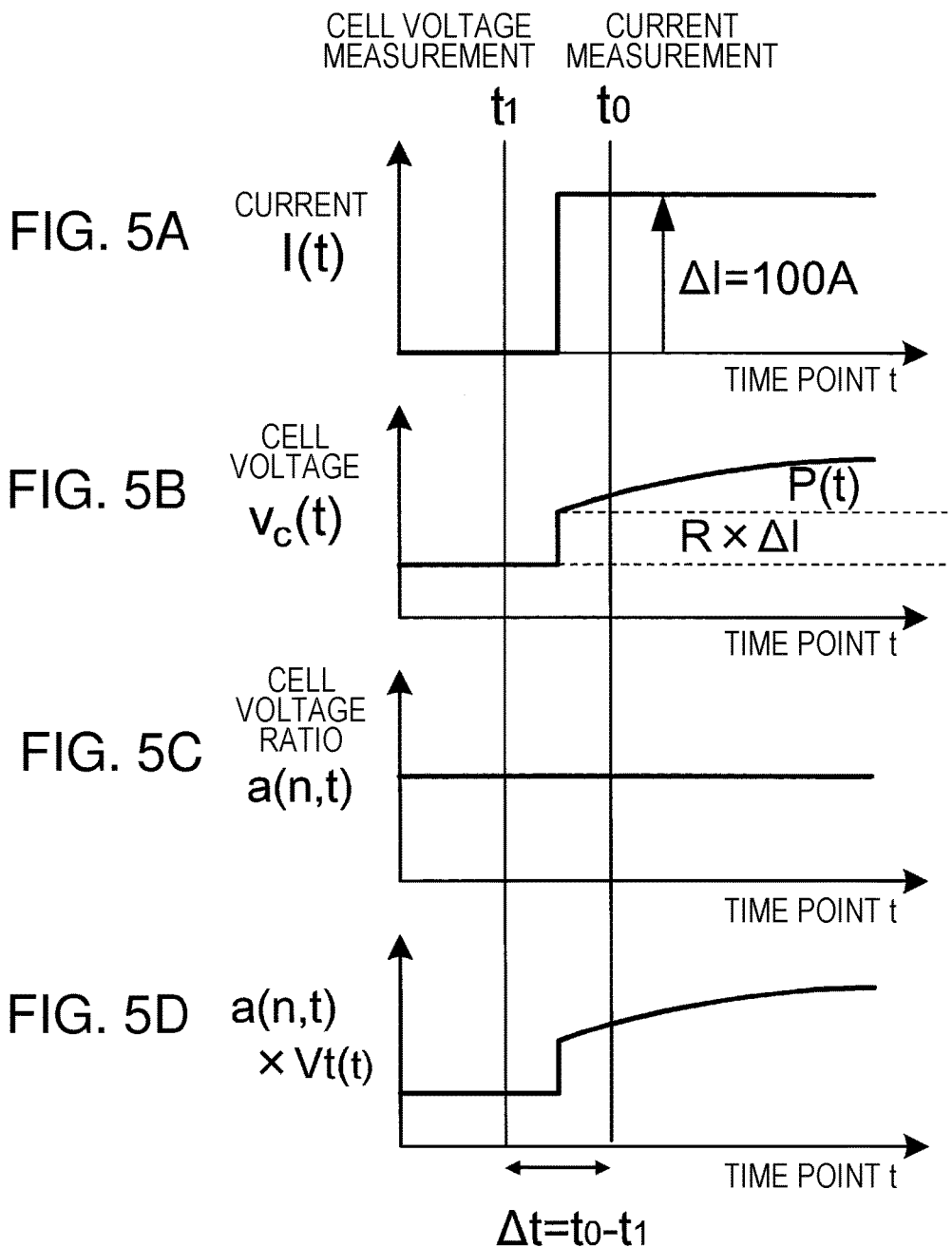

BATTERY MONITORING DEVICE THAT MONITORS A PLURALITY OF BATTERY CELLS CONNECTED IN SERIES

TECHNICAL FIELD

The present invention relates to a battery monitoring device monitoring a battery state.

BACKGROUND ART

A battery pack configured by connecting a plurality of battery cells of lithium-ion secondary batteries or secondary batteries such as nickel hydride batteries or lead batteries in a series-parallel manner is generally used together with a battery monitoring device. The battery monitoring device detects a battery state by detecting a cell voltage of each battery cell constituting the battery pack or by detecting a current flowing through the battery cell. Therefore, it is monitored whether the battery pack is in an appropriate state. In some cases, the battery monitoring device may have a function as a control device of controlling a conduction state in order to maintain the appropriate state.

In a general battery monitoring device, in order to discriminate whether or not each cell is overcharged or overdischarged, a voltage or a conducting current of each battery cell is detected or measured. In addition, in order to discriminate a deteriorated state of the battery, in some cases, an internal resistance of the battery cell may be detected. If the battery is deteriorated, the internal resistance is increased, and thus, the deteriorated state of the battery can be discriminated by detecting the internal resistance.

The detection of the internal resistance of the battery is performed by using a measured value of the voltage of the battery cell and a measured value of the conducting current. At this time, a timing of detecting the cell voltage of the battery cell by a voltage detection unit and a timing of detecting the current flowing through the battery cell by a current detection unit need to be synchronized with each other.

In a general battery state detection circuit, since the cell voltages of a plurality of the battery cells are configured to be sequentially measured, a cell voltage measurement period having a time width is needed for the measurement of the cell voltage. Therefore, it is difficult to set synchronicity between the measurement time point of the cell voltage and the measurement time point of the current to be shorter than the time width of the cell voltage measurement period. For this reason in a battery monitoring circuit of the related art, it is difficult to align the measurement time points of the voltage and the current for each battery cell, so that it is difficult to measure the internal resistance of the battery for each cell.

As a configuration of synchronizing the cell voltage detection timing and the current detection timing, considered is a configuration where a current detection unit is provided in a monitoring circuit provided with a voltage detection unit to perform detection of the cell voltage and detection of the current based on a clock of the monitoring circuit side.

However, in such a configuration, since the current needs to be detected while the cell voltage is detected for each battery cell in the monitoring circuit, there is a problem in that an amount of data treated by the monitoring circuit becomes large.

In contrast, PTL 1 discloses a configuration of allowing a deviation between the voltage detection timing in the monitoring circuit and a current detection timing in a control circuit and using a correction unit of correcting the deviation.

CITATION LIST

Patent Literature

PTL 1: JP 2012-154641 A

SUMMARY OF INVENTION

Technical Problem.

However, since the relationship between the deviation width of the detection timings and the correction amount is changed depending on a speed of change of the current or the voltage, there is a problem in that accurate correction cannot be performed in this method. Particularly, in the case where the current or the voltage is rapidly changed in time, there is a problem in that an error becomes large.

Solution to Problem

According to an aspect of the present invention, a battery monitoring device which monitors a battery pack where a plurality of battery cells are connected in series, includes: a first voltage measurement unit which measures a voltage between terminals of each of the battery cells; a second voltage measurement unit which measures a voltage of two ends of a battery cell group where at least two or more battery cells are connected in series among the plurality of the battery cells; a current measurement unit which measures a current flowing through the battery pack; a cell voltage ratio calculation unit which calculates each cell voltage ratio of the plurality of the battery cell based on the voltage between the terminals measured by the first voltage measurement unit; a cell voltage calculation unit which measures each cell voltage of the plurality of the battery cell at the time of measuring the voltage between the two ends based on the cell voltage ratio and the voltage between the two ends measured by the second voltage measurement unit; and a trigger signal generation unit which inputs trigger signals for acquiring the voltage between the two ends measured by the second voltage measurement unit and the current value measured by the current measurement unit as a set to the second voltage measurement unit and the current measurement unit, respectively.

Advantageous Effects of Invention

According to the present invention, it is possible to detect internal resistance of a plurality of battery cells for each cell.

BRIEF DESCRIPTION OF DRAWINGS

FIG. 1 is a diagram illustrating an example of a configuration of an electric vehicle driving device 100.

FIGS. 5A to 5D are diagrams illustrating an allowable time range Tp.

DESCRIPTION OF EMBODIMENTS

Figure 2A:
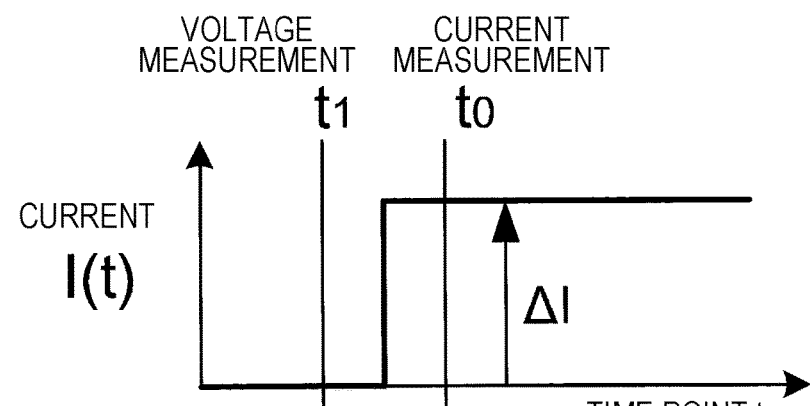
FIGS. 2A and 2B are diagrams illustrating a change of cell voltage when a conducting current of a battery pack 10 is changed.

Hereinafter, embodiments of the present invention will be described with reference to the drawings.

First Embodiment

A battery monitoring device according to the present invention is a device of detecting a battery state of a battery pack provided to a battery system (sometimes, referred to as power storage device) and maintaining an appropriate state of the battery pack. FIG. 1 illustrates an electric vehicle driving device 100 where a battery system 1 provided with the battery monitoring device 2 according to the embodiment is mounted. Herein, the electric vehicle driving device is a rotating machine system which drives an electric vehicle such as a hybrid electric vehicle (HEV) or an electric vehicle (EV).

The electric vehicle driving device 100 is configured to include a battery system 1 including a battery monitoring device 2, a battery pack 10, and the like, a vehicle controller 30 performing control of the entire vehicle, an inverter 40, a rotating electric machine 50, and the like. The battery system 1 is connected to the inverter 40 through relays 60 and 61. The battery monitoring device 2 performs communication with the inverter 40 and the upper-level vehicle controller 30 via a communication bus of CAN (Controller Area Network).

The rotating electric machine 50 is driven by a power from the inverter 40. At the time of starting and accelerating of the vehicle, a discharge power from the battery system 1 is supplied to the rotating electric machine 50 through the inverter 40, and an engine (not shown) is assisted by a driving force of the rotating electric machine 50. At the time of stopping and decelerating of the vehicle, the battery pack 10 provided to the battery system 1 is charged through the inverter 40 with a regenerating power from the rotating electric machine 50. In addition, the inverter 40 includes a motor controller 41 to perform driving control of the rotating electric machine 50 and charging/discharging control of the battery pack 10 by controlling DC-AC conversion and AC-DC conversion of the inverter 40.

The battery system 1 is configured to include a battery pack 10, a battery monitoring device 2, and a current measurement element 9. The battery pack 10 has a configuration where a plurality of battery cells C (C(1) to C(N)) as a minimum unit are connected in series. In addition, the battery pack 10 according to the embodiment has a configuration where, for example, fifty to one hundred battery cells C are connected in series. In the description hereinafter, the number of battery cells C constituting the battery pack 10 is denoted by N, and hereinafter, in the case where the N battery cells C(1) to C(N) is represented by one battery cell, the battery cell may be referred to as a battery cell C. As the battery cell C constituting the battery pack 10, for example, a rechargeable lithium-ion secondary battery is used. In the example illustrated in FIG. 1, the battery pack 10 including a plurality of the battery cells C constitutes a connection body formed by connecting, in series, a plurality (L in the example illustrated in FIG. 1) of cell blocks B1 to EL as groups of a predetermined number (four in the example illustrated in FIG. 1) of the battery cells.

(Configuration of Battery Monitoring Device 2)

The battery monitoring device 2 is a device of monitoring a state of the battery pack 10 and has an overcharge/overdischarge detecting function of detecting overcharge and overdischarge of each battery cell C of the battery pack 10, an internal resistance detecting function of detecting internal resistance of each battery cell C of the battery pack 10, and the like. The battery monitoring device 2 is configured to include, a cell voltage measurement unit 21, a second voltage measurement unit 22, a current measurement unit 23, a control unit 24 and the like.

The cell voltage measurement unit 21 is a circuit of measuring a voltage (hereinafter, referred to as a cell voltage) of each of the battery cells C constituting the battery pack 10. The cell voltage measurement unit 21 includes a plurality of cell voltage measurement circuits CC1 to CCL corresponding to the cell blocks B1 to BL. Each of the cell voltage measurement circuits CC1 to CCL is a circuit which can measure the cell voltages of about four to twelve battery cells C, and the cell voltage measurement circuits configured as integrated circuits (ICs) may be used.

The second voltage measurement unit 22 is a circuit which measures a voltage (hereinafter, referred to as a total voltage Vt) of all of the N battery cells constituting the battery pack 10. If the N battery cells C are denoted by reference numerals C(1), C(2), ..., C(N-1), and C(N) from the negative electrode side of the battery pack, second voltage input terminals 220a and 220b of the second voltage measurement unit 22 are connected to the negative electrode of the battery cell C(1) and the positive electrode of the battery cell C(N), respectively. Each of the cell voltage measurement circuits CC1 to CCL measures a voltage of each battery cell for each of the cell blocks B1 to BL. In addition, although not shown, the cell voltage measurement circuits CC1 to CCL are provided with a balancing resistor and a balancing switch which perform a balancing operation for the cell voltage of each of the battery cells C(l) to C(N) and a logic unit which performs control by performing communication with the control unit 24.

The current measurement unit 23 which measures a current flowing in the battery pack 10 is input with a measurement signal (electric signal) from the current measurement element 9. The current measurement element 9 is an element of converting a magnitude of the current to an electric signal, and more specifically, there are a Hall element sensor, a shunt resistor element, and the like. An electric signal corresponding to the magnitude of the current is output from the current measurement element 9, and electric signal is measured by the current measurement unit 23.

Due to the following points, the shunt resistor element is more excellent than the Hall element sensor. Since the shunt resistor element has a small offset current, it is possible to accurately (at a high accuracy) measure a state of charge (SOC) of the battery pack 10. In addition, since the shunt resistor element has a fast response characteristic (property of following of a voltage value with respect to a change of current), if a measurement time constant of the current measurement unit 23 is set to be fast, it is possible to increase a time resolution accordingly. Namely, the shunt resistor element is excellent in terms that the synchronicity of measurement is easy to achieve.

The control unit. 24 performs controlling the entire battery monitoring device 2 and performs, for example, operation control, state determination, and the like of the cell voltage measurement circuits CC1 to CCL. The control unit 24 receives signals transmitted from the cell voltage measurement unit 21, the second voltage measurement unit 22, and the current measurement unit 23 and detects the internal resistance of each of the battery cells C(1) to C(N) by using these signal values.

In the case where the number N of battery cells C(1) to C(N) constituting the battery pack. 10 is large, electrical insulation is needed for the connection between a high voltage side and a low voltage side of the battery monitoring device 2. For example, considered is the case where the N (=96) lithium-ion secondary batteries are connected in series. In this case, the voltage across the battery pack 10 becomes about 400 V. For this reason, there is a voltage difference of about 400 V between the cell voltage measurement circuit CC1 to which the battery cell. C(1) is connected and the cell voltage measurement circuit CCL to which the battery cell C(N) is connected. Therefore, the cell voltage measurement circuits CC1 to CCL and the control unit 24 need to be electrically insulated from each other. More specifically, as illustrated in FIG. 1, insulating elements 6 are inserted into connection lines (signal lines).

Similarly, the insulating elements 6 are inserted between the second voltage measurement unit 22 and the control unit 24 and between the current measurement unit 23 and the control unit 24. The insulating elements 6 may be inserted if needed. For example, like the case of N=4, in the case where the voltage of the battery pack 10 is not so high as the electrical insulation is needed, there is no need to insert the insulating elements 6.

(Description of Measurement Time Point Deviation According to Change in Current)

The influence of the time change of the conducting current of the battery pack 10 of the battery system 1 on the measurement time point deviation will be described. In the electric vehicle (HEV) illustrated in FIG. 1, an output torque of the rotating electric machine 50 is changed in time according to a running state of the electric vehicle. For example, if the engine needs to be assisted by the rotating electric machine 50, in order to increase the output torque of the rotating electric machine 50, the output power of the inverter 40 is increased accordingly. Therefore, the input current of the inverter 40, that is, the conducting current of the battery pack 10 is also increased. Reversely, if the electric vehicle uses a regeneration brake to be in a regeneration state, the rotating electric machine 50 operates as a generator, so that the regenerating power is flowed from the rotating electric machine 50 (generator) through the inverter 40 to the battery pack 10. For this reason, the charge current for the battery pack 10 is increased. In this manner, in the battery system 1, the conducting current of the battery pack 10 is changed in time.

Figure 2B:
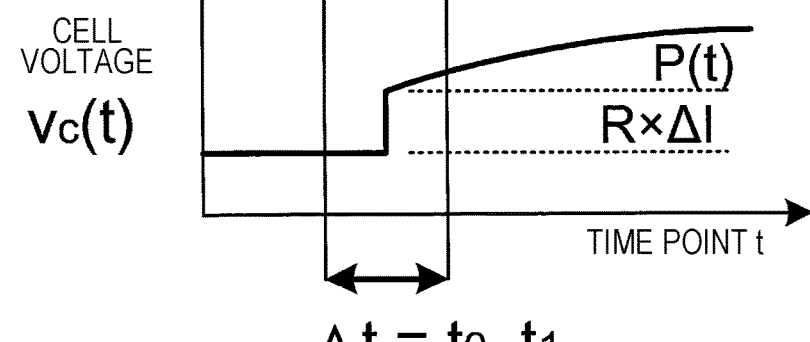

FIGS. 2(a) and 2(b) are diagrams illustrating a change of the cell voltage when the conducting current of the battery pack 10 is changed. FIG. 2(a) illustrates a change of the current, and FIG. 2(b) illustrates a change of the cell voltage. Like FIG. 2(a), if the current I(t) is changed by $\Delta I$ at a time point, the change of the cell voltage at this time is represented by a component which immediately responds to the change of the current and a component which is changed with time delay as illustrated in FIG. 2(b). The component which immediately responds is referred to as a direct-current internal resistance component (DCR: Direct-Current Resistance), and the component which is changed with time delay is referred to as a polarization component (Polarization). The direct-current internal resistance component is a change of voltage caused by internal resistance R of the battery cell C and is represented by $R \times \Delta I$. The polarization component is a component of a change of voltage caused :by factors such as capacitance or inductance of the battery cell C or behavior of ions in an electrolyte.

However, in the battery monitoring device 2, as described above, the internal resistance of the battery cell C is detected. Since the internal resistance is calculated based on the voltage (cell voltage) of the battery cell C and the current flowing in the battery cell C, in order to obtain the internal resistance at a good accuracy, it is necessary to accurately measure the cell voltage and the current Herein, as illustrated in FIGS. 2(a) and 2(b), it is assumed that a time point t1 of the cell voltage measurement in the cell voltage measurement unit 21 and a time point t0 of the current measurement in the current measurement unit 23 are deviated from each other. In addition, considered is the case where the internal resistance Rc of the battery cell C is obtained as $vc(t1)/I(t0)$ from a cell voltage measurement value $vc(t1)$ at the time point t1 and a current measurement value $I(t0)$ at the time point t0. Since the cell voltage measurement value $vc(t1)$ is smaller than the cell voltage value $vc(t0)$ at the time point t0, $vc(t1)/I(t0)$ becomes smaller than a correct internal resistance value ($vc(t0)/I(t0)$). In this manner, if there is a deviation between the time point of the cell voltage measurement and the time point of the current measurement, a correct internal resistance cannot be obtained.

(Time Required for Cell Voltage Measurement)

Figure 3:
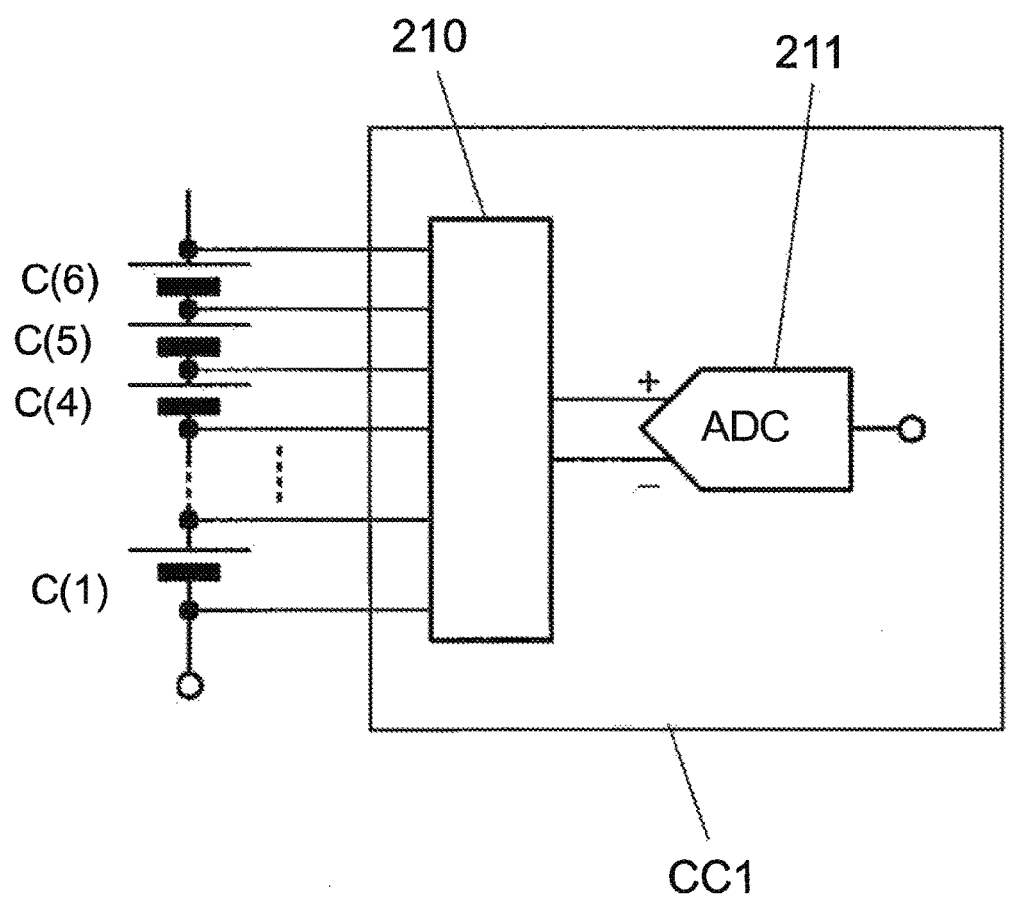
FIG. 3 is a diagram illustrating an example of a typical configuration of cell voltage measurement circuits CC1 to CCL illustrated in FIG. 1.

Next, the cell voltage measurement in the battery monitoring device 2 will be described. FIG. 3 is a diagram illustrating an example of a typical configuration of the cell voltage measurement circuits CC1 to CCL illustrated in FIG. 1. The cell voltage measurement circuits CC1 to CCL have the same configuration, and thus, FIG. 3 illustrates the cell voltage measurement circuit CC1. In addition, in the example illustrated in FIG. 1, the number of battery cells C constituting the cell block B1 is set to be four, but for the description, the case where the number of battery cells C is six is illustrated in FIG. 3.

As described above, each of the cell voltage measurement circuits CC1 to CCL can measure the cell voltages of about four to twelve battery cells C and is configured to include a selection circuit 210 which selects to-be-measured battery cells C(1) to C(6) and a voltage detection circuit 211. More specifically, as the selection circuit 210, a multiplexer or the like is used, and the voltage detection circuit 211 is generally configured with an AMP and an analog-to-digital converter.

Figure 4A:
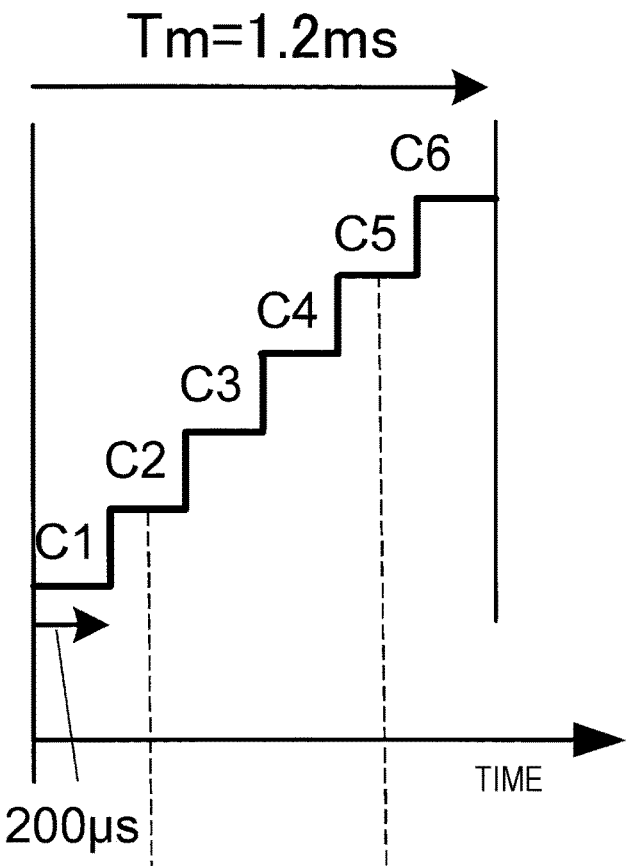
FIGS. 4A and 4B are schematic diagrams illustrating a measurement sequence in a cell voltage measurement circuit CC1.
Figure 4B:
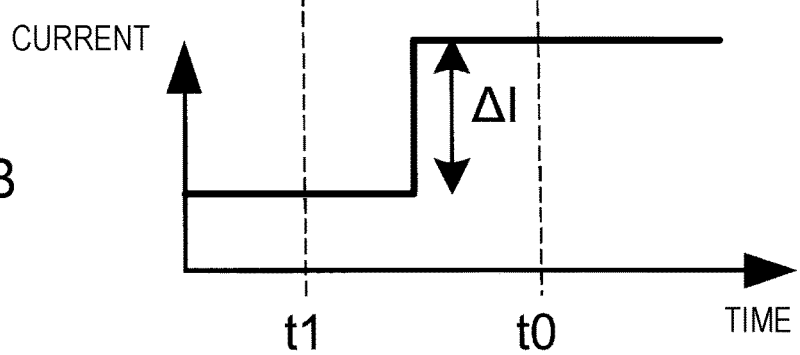

FIGS. 4(a) and 4(b) are schematic diagrams illustrating a typical measurement sequence in the cell voltage measurement circuit CC1 illustrated in FIG. 3. FIG. 4(a) is a timing chart illustrating cell voltage measurement timing of the battery cells C(1) to C(6), and FIG. 4(b) illustrates a change of the current. As illustrated in FIG. 4(a) the selection circuit 210 sequentially selects the battery cells like a sequence of battery cell C(1)→battery cell C(2)→battery cell (3)→battery cell C(4)→battery cell C(5)→battery cell (6). The voltage detection circuit 211 sequentially measures the cell, voltages for every one cell Hereinafter, the cell voltage measured by the voltage detection circuit 211 is referred as a cell voltage measurement value.

Therefore, in case of measuring the cell voltages of six battery cells C(1) to C(6), the time required for the cell voltage measurement (herein, referred to as a cell voltage measurement period) Tm becomes six time the time required for the measurement of one cell For example, since a typical value of the time required for the measurement of one cell is 200 μs, in this case, the cell voltage measurement period Tm becomes 1.2 ms.

Herein, considered is the case where the current is changed by ΔI during the cell voltage measurement period Tm as illustrated in FIG. 4(b). In case of measuring the current at the time point t0, with respect to the battery cell C(5), the voltage and the current are measured simultaneously. However, with respect to the battery cell C(2), since the cell voltage is measured at the time point t1, the voltage and the current are measured at different time points (time point t1 and time point t0), and thus, during the time interval, the current is changed by ΔI. For this reason, with respect to the battery cell C(2), a correct internal resistance cannot be measured.

Therefore, in the present invention, as described later, by using the fact that the time change of a "cell voltage ratio" is small, the cell voltage value and the current value are enabled to be measured at substantially synchronized time points. Accordingly, even in the case where the current is changed in time as illustrated in FIG. 4(b), it is possible to measure the internal resistance for each cell at a good accuracy.

In the present invention, the "cell voltage ratio" is a ratio of an individual cell voltage measurement value to a total sum of N cell voltage measurement values vc(1,t) to vc(N,t) In the specification, a cell voltage ratio of a battery cell C(k) at a time time t is denoted by a (k, t). The cell voltage ratio a (k, t) is obtained by the following Formula (1). In addition, in Formula (1), vc(k, t) is a cell voltage measurement value of the battery cell C(k) at the time point t.

[Mathematical Formula 1]

$$a(k,t) = \frac{v_c(k,t)}{\sum_{j=1}^{N} v_c(j,t)} \quad (1)$$

If the cell voltage ratio a (k,) is obtained by Formula (1), the cell voltage of each of the battery cells C(1) to C(N) can be calculated from the cell voltage ratio and a total voltage Vt measured by the second voltage measurement unit 22 by the following Formula (2). Herein, the cell voltage vc (k, t0) calculated by Formula (2) is referred to as a cell voltage calculation value. In Formula (2), the time point t0 is a measurement time point of the total voltage Vt by the second voltage measurement unit 22. On the other hand, the time point t2 in the cell voltage ratio a (k, t2) is a measurement time point of each of the battery cells C(1) to C(N) in each of the cell voltage measurement circuits CC1 to CCL. Since each of the cell voltage measurement circuits CC1 to CCL starts the cell voltage measurement almost at the same timing, the N cell voltage measurement values vc(1, t) to vc(N, t) are measured within the cell voltage measurement period Tm of FIGS. 4(a) and 4(b).

[Mathematical Formula 2]

$$v_c(k,t0) = a(k,t2) \times V_t(t0) \quad (2)$$

The important thing herein is that, if the time point deviation between the measurement time point (cell voltage measurement time point) t2 of the cell voltage ratio a(k, t2) and the measurement time point t0 of the total voltage Vt is within the later-described allowable time range Tp, the time point deviation is allowable. This is because the time change of the cell voltage ratio a(k, t2) is sufficiently small within the period of the allowable time range Tp as described later. In addition, the calculation of the cell voltage ratio a(k, t) by Formula (1) and the calculation of the cell voltage calculation value vc(k,t0) of each battery cell C(k) by Formula (2) are performed by a calculation unit 240 of the control unit 24.

(Allowable Time Range Tp)

Next, the allowable time range Tp where the time change of the cell voltage ratio a(k, t2) is considered to be sufficiently small will be described with reference to FIGS. 5(a) to 5(d). The inventors found out from the result of calculation of the behavior of the battery pack 10 by using typical characteristic values of a lithium-ion battery that the cell voltage ratio becomes constant in an error range of $5 \times 10^{-6} \times \Delta I$ within a time range of 10 ms. Herein, ΔI is a value of a change amount of the current within the time range of 10 ms as represented in units of ampere (A).

For example, in case of ΔI=100 (A), the error of the cell voltage ratio within the time range of 10 ms becomes about $5 \times 10^{-4} = 0.05\%$. In addition, in the calculation of the error, besides the direct-current resistance (DCR) component of the battery cell C, the polarization comport (P(t) of FIG. 2(b)) is also considered. Therefore, if the current change ΔT considered in the battery system is about 100 (A) in maximum, since the error of the cell voltage ratio in a time range of 10 ms is about 0.05% and is considered to be almost constant, 10 ms can be set as an allowable time range Tp.

However, the allowable time range Tp is not a value fixed as 10 ms but a value changed according to an allowable error range or the like. For example, in case of a battery monitoring device having an allowable error of about 0.3%, the allowable time range Tp becomes 50 ms.

In this manner, as illustrated in FIG. 5(c), it can be considered that the cell voltage ratio a(k, t2) is constant in the time period of the allowable time range Tp. Namely, in the case where the cell voltage ratio a(k, t2) and the total voltage Vt(t0) are acquired in the allowable time range Tp, as illustrated in FIG. 5(d), a cell voltage calculation value vc(t0) corresponding to the measurement time point t0 of the total voltage Vt(t0) is obtained by obtaining a product of the cell voltage ratio a(k, t2) and the total voltage Vt(t0) according to Formula (2).

(Cell Voltage Calculation Values as Cell Voltages at the Synchronized Time Point)

As described, in the embodiment, in the calculation of the cell voltage ratio, instead of the cell voltage measurement values vc(1, t) to vc(N, t) measured by the cell voltage measurement unit 21, the cell voltage calculation values vc(1, t0) to vc(N, t0) calculated by Formula (2) are used. Therefore, the cell voltages (that is, the cell voltage calculation values vc(1, t0) to vc(N, t0)) at the time point synchronized with the measurement time point t0 of the total voltage Vt(t0) by the second voltage measurement unit 22 can be calculated at a high accuracy. Next, the internal resistance of each of the battery cells C(1) to C(N) is obtained based on the calculated cell voltage calculation values vc(1, t0) to vc (N, t0) and the current value measured by the current measurement unit 23.

Figure 6:
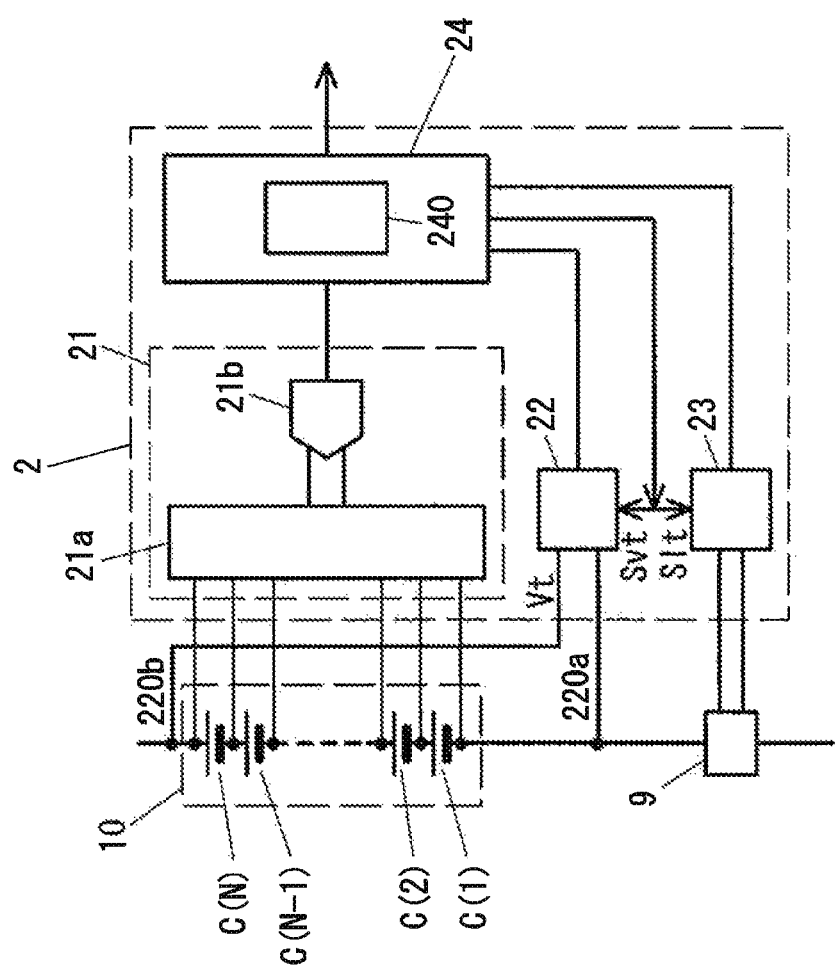
FIG. 6 is a diagram illustrating an internal resistance deriving operation of a battery monitoring device 2.

An internal resistance deriving operation of the battery monitoring device 2 will be described with reference to FIG. 6. In addition, for simplifying the description, the battery monitoring device 2 illustrated in FIG. 6 is illustrated as a configuration where any one of the N battery cells C(1) to C(N) is selected by a selection circuit 21a provided to the cell voltage measurement unit 21 and a cell voltage of the selected battery cell is measured by a voltage detection circuit 21b. The selection circuit 21a and the voltage detection circuit 21b are circuits having the same functions as those of the selection circuit 210 and the voltage detection circuit 211 illustrated in FIG. 3.

In addition, in the embodiment, as illustrated in FIG. 1, the cell voltage measurement unit 21 may be also configured with a plurality of the cell voltage detection circuits CC1 to CCL. FIGS. 9, 10, 11, and 13 are similarly used.

In the cell voltage measurement unit 21, the battery cells C(1) to C(N) are sequentially selected by the selection circuit 21a, and the voltage of the battery cell selected by the selection circuit 21a is measured by the voltage detection circuit 21b. The actual configuration of the cell voltage measurement unit 21 is the same as that in FIG. 1, and thus, as described above, the time required for measurement of the cell voltage of each of the battery cells C(1) to C(N) is about 1 ms. The cell voltage measurement value measured by the cell voltage measurement unit 21 is transmitted to the control unit 24 through a signal line.

The calculation unit 240 of the control unit 24 calculates the cell voltage ratio a (k, t) for each of the battery cells C(1) to C(N) by using the cell voltage measurement value measured by the voltage detection circuit 21b and the above-described Formula (1). The control unit 24 transmits a voltage measurement trigger signal Svt to the second voltage measurement unit 22 and transmits a current measurement trigger signal Sit to the current measurement unit 23.

The second voltage measurement unit 22 receives the voltage measurement trigger signal Svt and measures a voltage between the second voltage input terminals 220a and 220b at the time point t0. Since the voltage between the second voltage input terminals 220a and 220b is the voltage between terminals of the entire battery pack, the voltage corresponds to the total voltage Vt(t0). The measured voltage value (that is, the total voltage Vt(t0)) is transmitted to the control unit 24. The current measurement unit 23 receives the current measurement trigger signal Sit and measures the current value of the battery pack 10 at the time point t0. The measured current value I(t0) is transmitted to the control unit 24. The control unit 24 calculates the cell voltage calculation value vc (k, t0) of each of the battery cells C(1) to C(N) at the time point t0 by using the transmitted cell voltage ratio a (k, t), the transmitted total voltage Vt(t0), and Formula (2).

As described above, the second voltage measurement unit 22 and the current measurement unit 23 receive the respective trigger signals Svt and Sit to start the measurement. In the specification, the trigger signal includes a transmission signal of a software instruction as well as a pulse-type signal Namely, the present invention also includes the case where a microcomputer included in the control unit 24 transmits a software instruction of instructing measurement start of the second voltage measurement unit 22 and the current measurement unit 23 and the second voltage measurement unit 22 and the current measurement unit 23 perform the measurement by using the software instruction as trigger signals so that the measurement time points are synchronized with each other.

As described above, since the time change of the cell voltage ratio a(k, t) in the allowable time range Tp is sufficiently small, all of the cell voltage calculation values obtained in this manner correspond to the cell voltage measured at the time point t0 (measurement time point of the total voltage by the second voltage measurement unit 22) The internal resistance of each of the battery cells C(1) to C(N) is obtained by using the cell voltage calculation value vc (k, t0) at the time point t0 and the current value I (t0) at the time point t0 obtained in this manner. In this case, since both the cell voltage calculation value vc (k, t0) and the current value I(t0) are values at the time point t0, although the cell voltage or the current is changed in time in the allowable time range Tp, a correct (highly-accurate) internal resistance is obtained.

(Synchronicity of Total Voltage Measurement and Current Measurement)

As described above, since the cell voltages (cell voltage calculation values) of the plurality of the battery cells C(1) to C(N) at the synchronized time point are obtained, in order to further reduce the calculation error of the internal resistance, the synchronicity of the total voltage measurement and the current measurement is important The feature of the embodiment is that the measurement time points of the second voltage measurement unit 22 and the current measurement unit 23 are controlled to be substantially synchronized with each other.

Figure 7A:
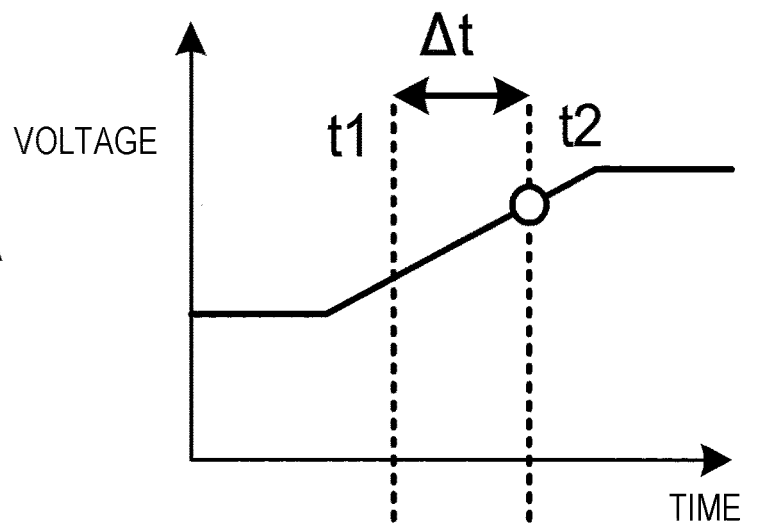
FIGS. 7A and 7B are diagrams illustrating an allowable value of a measurement time point deviation.
Figure 7B:
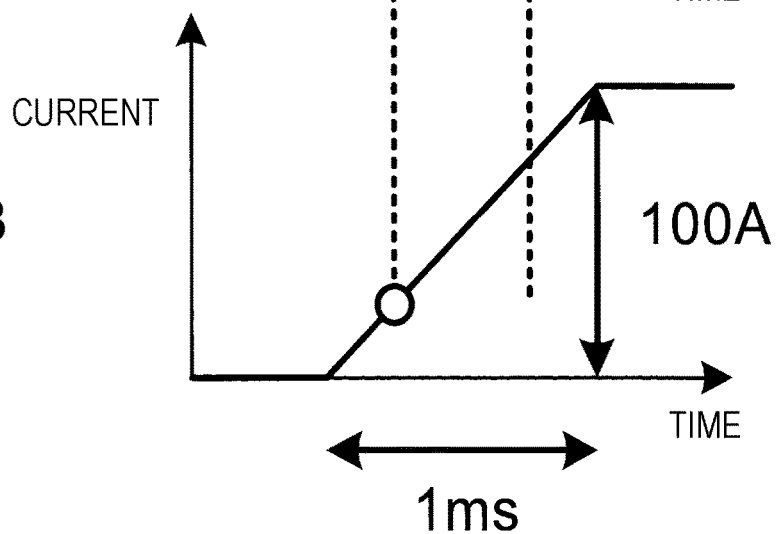

Hereinafter, with respect to what a measurement time point deviation of the second voltage measurement unit 22 and the measurement of the current measurement unit 23 is allowable, that is, the measurement time point deviation which is allowable in order to calculate the internal resistance at a desired accuracy will be described. First, as illustrated in FIG. 7(b) considered is the case where the current is changed by ΔI=100 A in a time period of 1 ms. Next, considered is the case where the current is measured at the time point t1 and the voltage (total voltage Vt) is measured at the time point t2. FIG. 7(b) illustrates a change of the current, and FIG. 7(a) illustrates a change of the voltage.

Figure 8:
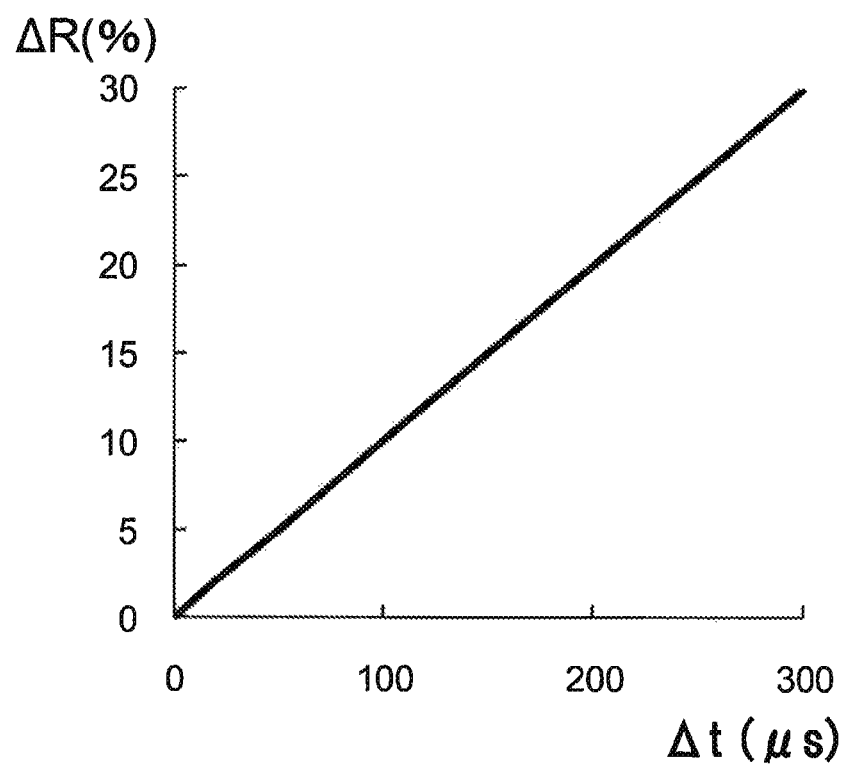
FIG. 8 is a diagram illustrating a relationship between a measurement time point deviation Δt and an internal resistance measurement error ΔR.

FIG. 8 illustrates a relationship between the measurement time point deviation Δt=t2−t1 and the internal resistance measurement error ΔR. Since it is preferable that the internal resistance of the battery cell is measured in an error range of ±20%, the allowable time point deviation becomes ±200 μs or less according to the relationship of FIG. 8. In this case, in the present invention, "the measurement time point of the second voltage measurement unit 22 and the measurement time point of the current measurement unit 23 are substantially synchronized times" denotes that, if the time point deviation is ±200 μs or less, the time points are considered as "synchronized" time points. In addition, more preferably, in order to measure the internal resistance in an error range of ±1%, the allowable time point deviation becomes ±10 μs or less.

In addition, the allowable time point deviation depends on a maximum change rate of the to-be-measured current waveform. For example, low pass filters are provided to the second voltage measurement unit 22 and the current measurement unit 23, and in the case where time changes of the voltage and current waveforms which are to be observed are slowed down, the allowable measurement time point deviation is also increased by a slowed-down amount of the time change. The point is quantitatively described later.

Herein, if the maximum time-change rate of the current which is to be observed is denoted by Imax', the allowable measurement time point deviation Δt is represented by the following Formula (3). The maximum time-change rate Imax' is a quantity defined by the following Formula (4). Herein, function max ( ) is a function of returning a maximum value. In Formula (3), α is a measurement error allowable for the measurement value of the internal resistance, and I0 is an average current value. As described above, the allowable measurement error α is preferably ±20%, more preferably ±1%. As can be understood from Formula (3), if the low pass filter is provided, since Imax that is the time change of the current waveform is decreased, the allowable time point deviation Δt is increased.

[Mathematical Formula 3]

$$\Delta t \leq \alpha \left| \frac{I_0}{I'_{max}} \right| \quad (3)$$

$$I'_{max} = \max\left(\frac{dI}{dt}\right) \quad (4)$$

Second Embodiment

A second embodiment of the present invention will be described with reference to FIG. 9. In the first embodiment described above, the cell voltage was calculated by Formula (2) at the time point substantially synchronized with the current measurement time point based on the cell voltage ratio a (k, t) and the total voltage Vt (total voltage of the battery pack) measured by the second voltage measurement unit 22. In the second embodiment described hereinafter, as the voltage measured by the second voltage measurement unit 22, not the total voltage Vt of the battery pack 10 but an intermediate voltage Vm (voltage of M battery cells connected in series: M is a natural number of 2 to N−1) is configured to be used.

Figure 9:
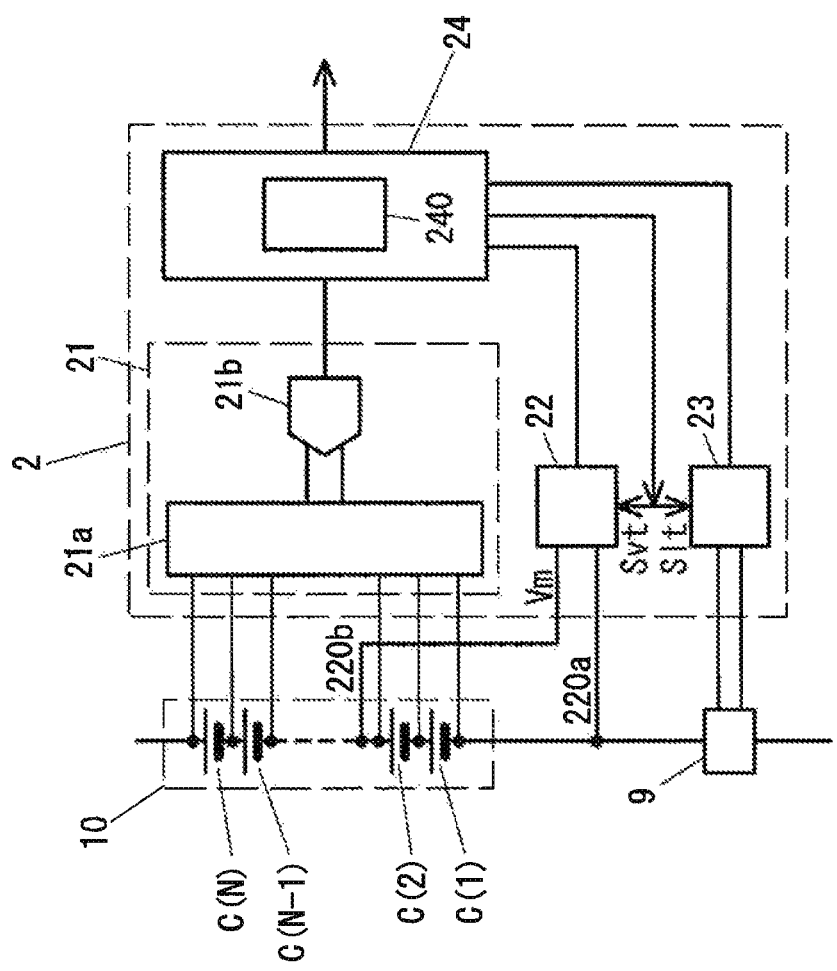
FIG. 9 is a diagram illustrating a battery monitoring device according to a second embodiment.

In addition, for simplifying the description, the battery monitoring device 2 illustrated in FIG. 9 is illustrated as a configuration where any one of the N battery cells C(1) to C(N) is selected by a selection circuit 21a provided to the cell voltage measurement unit 21 and a cell voltage of the selected battery cell is measured by a voltage detection circuit 21b. In the embodiment, as illustrated in FIG. 1, the cell voltage measurement unit 21 maybe also configured with a plurality of the cell voltage detection circuits CC1 to CCL.

In the example illustrated in. FIG. 9, a second voltage input terminal 220a is connected to a negative electrode side of the battery cell C(1), a second voltage input terminal 220b is connected to a positive electrode side of the battery cell C(2), and a sum of the voltage of the battery cell C(1) and the voltage of the battery cell C(2) is measured as an intermediate voltage Vm. In the second embodiment, similarly to the first embodiment, a second voltage measurement unit 22 and a current measurement unit 23 receive trigger signals Svt and Sit and perform measurement so that the measurement time points are substantially synchronized with each other.

In the embodiment, in the manner, the cell voltage vc(k, t0) at the time point t0 (voltage measurement time point of the second voltage measurement unit 22) is calculated. For example, in the case where the voltage between two ends of the M battery cells of the first battery cell C(1) to the M-th battery cell C(M) is denoted by the intermediate voltage Vm, the intermediate voltage Vm(t0) and the above-described total voltage Vt(t0) may be associated with each other by the following Formula (5). If the total voltage Vt (t0) obtained by Formula (5) is inserted into the above-described Formula (3), the cell voltage vc (k, t0) is obtained by the following Formula (6). In Formula (6), B(t2) is a correction coefficient calculated from the cell voltage ratio and is defined by the following Formula (7).

[Mathematical Formula 4]

$$V_m(t0) = V_t(t0) \times \sum_{j=1}^{M} a(j, t2) \quad (5)$$

$$v_c(k, t0) = a(k, t2) \times V_m(t0) \times \frac{1}{\sum_{j=1}^{M} a(j, t2)} \quad (6)$$

$$= a(k, t2) \times V_m(t0) \times B(t2)$$

$$B(t2) = \frac{1}{\sum_{j=1}^{M} a(j, t2)} \quad (7)$$

As can be understood from Formula (6), since the correction coefficient B(t2) is calculated from the cell voltage ratio, similarly to the cell voltage ratio, the correction coefficient is constant in the allowable period range Tp. Therefore, as illustrated in Formula (6) the cell voltage calculation value vc(k,t0) at the time point t0 is obtained from the intermediate voltage Vm(t0) measured at the time point t0. The timing of performing the calculation process for the correction coefficient B(t2) may be the time points of measuring the cell voltages C(1) to C(N) of the battery cells in the cell voltage measurement unit 21. The calculation for the correction coefficient B(t2) is performed by the calculation unit 240 of the control unit 24. In the example illustrated in FIG. 9, although the voltage between the two ends of the battery cells C(1) to C(2) is used as the intermediate voltage Vm, a voltage between the two ends of arbitrary M consecutive battery cells in the battery pack 10 may be used as the intermediate voltage. For example, in the case where the voltage between the two ends of N battery cells of the i-th battery cell C(i) to the (i+M) -th battery cell C(i+M) is used as the intermediate voltage Vm, as a total sum (Σ) of the denominator of Formula (7) for the correction coefficient B(t2) a total sum from j=i to j=M+i may be taken.

In the embodiment, by using the intermediate voltage Vm(t0) instead of the total voltage Vt(t0), since the magnitude of the voltage value which is to be measured by the second voltage measurement unit 22 becomes smaller than that of the case where the total voltage Vt(t0) is measured, it is possible to obtain an effect that the voltage measurement circuit can be easily manufactured. Particularly, since the withstand voltage required for the circuit becomes small, it is possible to reduce the circuit area of the second voltage measurement unit 22.

Third Embodiment

Figure 10:
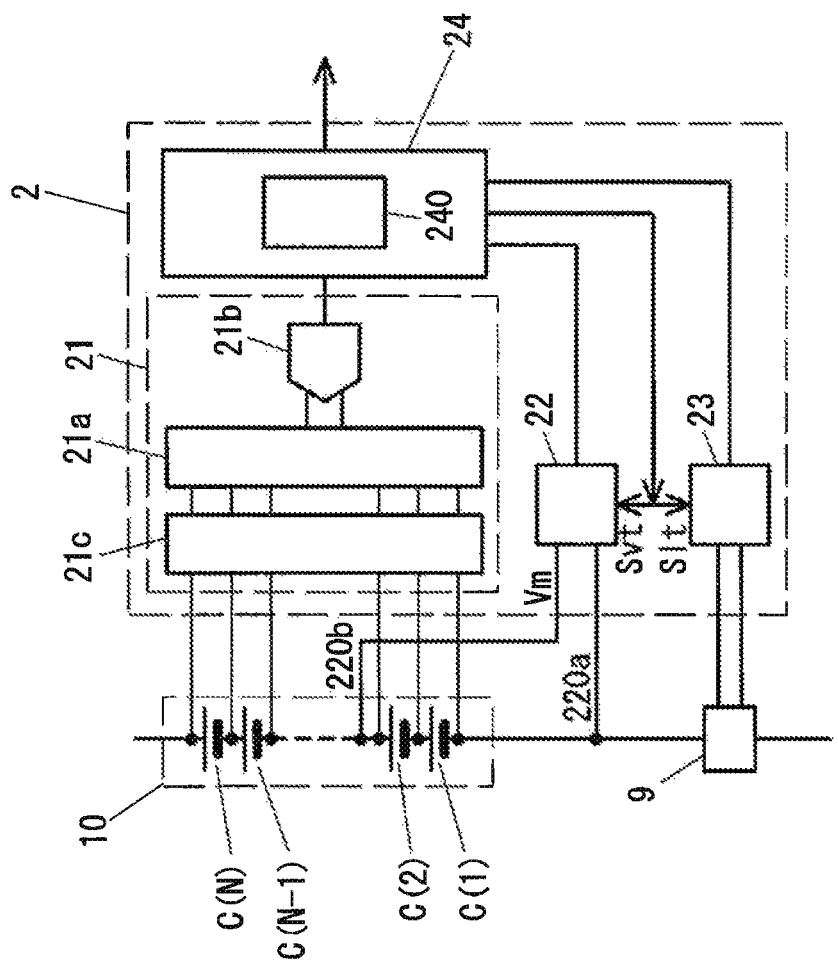
FIG. 10 is a diagram illustrating a battery monitoring device according to a third embodiment.

A battery monitoring device according to a third embodiment of the present invention will be described with reference to FIG. 10. In the embodiment, as illustrated in FIG. 10, a cell voltage measurement unit. 21 is configured to include a cell voltage filter 21c. The cell voltage filter 21c is a filter having a function of averaging cell voltage signals in time, and typically, a low pass filter is used. As described above, since the cell voltage ratio a (k, t) is changed slowly in time, the response time of the cell voltage measurement unit 21 measuring the cell voltage may be slow. Therefore, the cell voltage filter 21c is provided to average the cell voltage signals in time, and thus, electrical noise is reduced, so that it is possible to accurately measure the cell voltage ratio a (k, t).

In addition, for simplifying the description, the battery monitoring device 2 illustrated in FIG. 10 is illustrated as a configuration where any one of the N battery cells C(1) to C(N) is selected by a selection circuit 21a provided to the cell voltage measurement unit 21 and a cell voltage of the selected battery cell is measured by a voltage detection circuit 21b. In the embodiment, as illustrated in FIG. 1, the cell voltage measurement unit 21 may be also configured with a plurality of the cell voltage detection circuits CC1 to CCL.

In addition, as illustrated in FIGS. 4(a) and 4(b), a time period of a cell voltage measurement period Tm is required for the cell voltage measurement. In the time period of the cell voltage measurement period Tm, if the cell voltage is not changed, the cell voltage measurement can be accurately performed. Therefore, the cell voltage filter 21c is provided to limit a signal band and, thus, signal is smoothened, so that the accuracy of the cell voltage ratio a (k, t) can be increased. In order to further improve the effect, it is preferable that a characteristic time constant of the cell voltage filter is defined so that the time change of the cell voltage signal in the cell voltage measurement period Tm becomes small. More specifically, it is preferable that a low pass time constant of the cell voltage filter 21c is set to be two or more times the cell voltage measurement period Tm. By doing in this manner, although the current is changed during the cell voltage measurement period Tm, after passing through the cell voltage filter, the voltage signal is not almost changed, so that it is possible to obtain the cell voltage ratio a (k, t) at a good accuracy.

In addition, the cell voltage measurement period Tm denotes a time required for roughly measuring the voltages of the battery cells C(1) to C(N) constituting the battery pack 10. For example, considered is that case where the cell, voltage measurement unit 21 is configured to include a plurality of cell voltage measurement circuits CC1 to CCL as illustrated in FIG. 1, and each of the cell voltage measurement circuits CC1 to CCL is configured to include a selection circuit 210 such as a multiplexer and a voltage detection circuit 211 as illustrated in FIG. 3. Since the cell voltage measurement circuits CC1 to CCL can start the measurement almost at the same time by applying trigger signals to the cell voltage measurement circuits CC1 to CCL, the time of roughly measuring the cell voltages of the battery cells connected to the cell voltage measurement circuits CC1 to CCL becomes the cell voltage measurement period Tm. In the case of FIG. 1, the time period required for measuring the cells C(1) to C(4) is the cell voltage measurement period Tm.

In addition, according to a configuration of the cell voltage measurement circuits CC1 to CCL, in some case, a circuit calibration process of performing zero point correction or the like may be performed after the above-described time period. However, the time period of the circuit calibration process is not included in the cell voltage measurement period Tm. This is because a change of the cell voltage value during the circuit calibration process does not influence the cell voltage measurement.

Fourth Embodiment

A battery monitoring device according to a fourth embodiment of the present invention will be described with reference to FIG. 11. In the embodiment, a second voltage measurement unit 22 is also provided with a second voltage input filter 22a having a low pass characteristic, and a characteristic time constant of a cell voltage filter 21c and a characteristic time constant of the second voltage input filter 22a are set to be different from each other. A voltage signal applied to the second voltage measurement unit 22 passes through the second voltage input filter 22a, and after that, the voltage signal is input to a voltage detection circuit 22b, as an AD converter, so that an analog signal is converted to a digital signal. In addition, a current measurement unit 23 is provided with a current input filter 23a.

Figure 11:
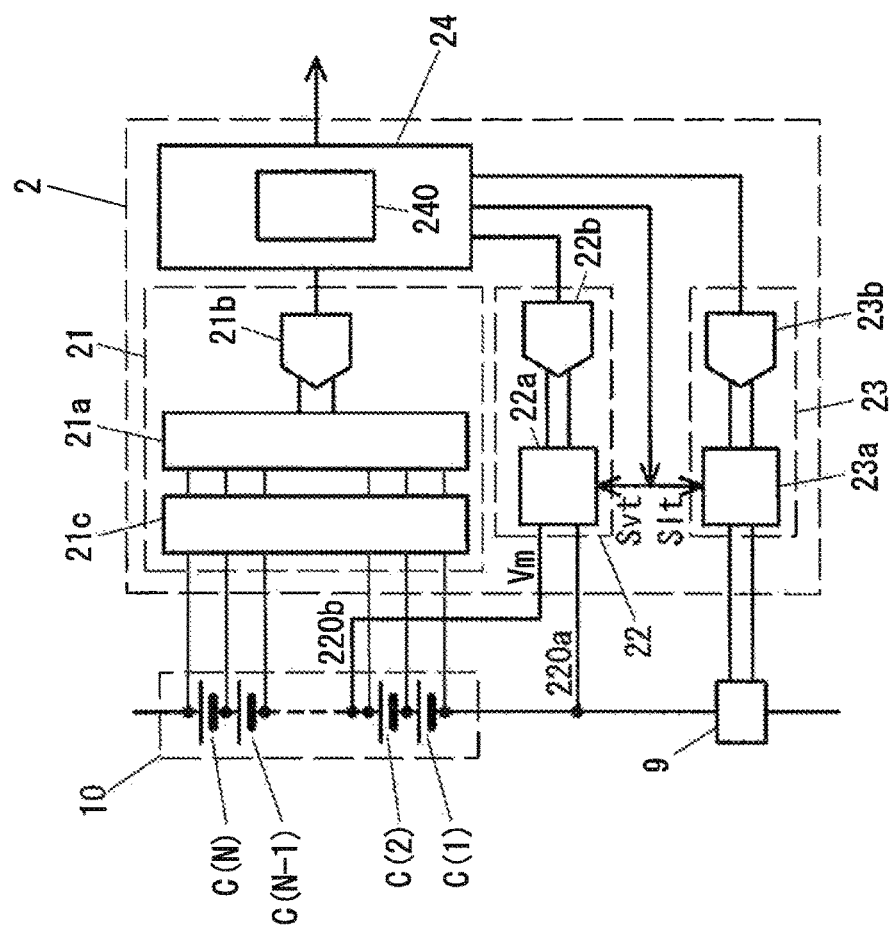
FIG. 11 is a diagram illustrating a battery monitoring device according to a fourth embodiment.

In addition, for simplifying the description, the battery monitoring device 2 illustrated in FIG. 11 is illustrated as a configuration where any one of the N battery cells C(1) to C(N) is selected by a selection circuit 21a provided to the cell voltage measurement unit 21 and a cell voltage of the selected battery cell is measured by a voltage detection circuit 21b. In the embodiment, as illustrated in FIG. 1, the cell voltage measurement unit 21 may be also configured with a plurality of the cell voltage detection circuits CC1 to CCL.

As illustrated in FIG. 11, the second voltage input filter 22a is provided to the second voltage measurement unit 22, and thus, as described above, even in the case where the characteristic time constant of the cell voltage filter 21c is long, the characteristic time constant of the second voltage input filter 22a of the second voltage measurement circuit 22 can be set to be short. As described with reference to FIGS. 5(a) to 5(d), in the present invention, the measurement time constant of the cell voltage (cell voltage calculation value calculated by Formula (2) or (6) described above) is dominated by a response time constant of the second voltage measurement circuit 22. Therefore, as described above, even in the case where the characteristic time constant of the cell voltage filter is set to be long, if the characteristic time constant of the second voltage input filter 22a is set to be shorter than the characteristic time constant of cell voltage filter 21c, the cell voltage can be measured by using the response time constant of the second voltage measurement circuit.

As described above, from the point of view that the cell voltage ratio a(k,t) can be measured at a good accuracy, it is preferable that the characteristic time constant of the cell voltage filter 21c is set to be long. Therefore, according to the configuration of the embodiment, it is possible to achieve both a high measurement accuracy and a high-speed response characteristic. In order to further improve the effect, it is more preferable that the characteristic time constant of the second voltage filter 22a of the second voltage measurement unit 22 is set to be ½ or less of the characteristic time constant of the cell voltage filter 21c.

Fifth Embodiment

In a battery monitoring device according to a fifth embodiment of the present invention, the response characteristic of the second voltage measurement unit 22 and the response characteristic of the current measurement unit 23 in FIG. 1 are set to be the same as each other. Herein, "the response characteristics are the same as each other" is (defined by the state that a characteristic frequency of a transfer function of the second voltage measurement unit 22 and a characteristic frequency of a transfer function of the current measurement unit 23 are the same as each other. The transfer function of each measurement unit is a ratio of voltage amplitudes between input and output signals of the measurement unit. The transfer function is called a gain.

Figure 12:
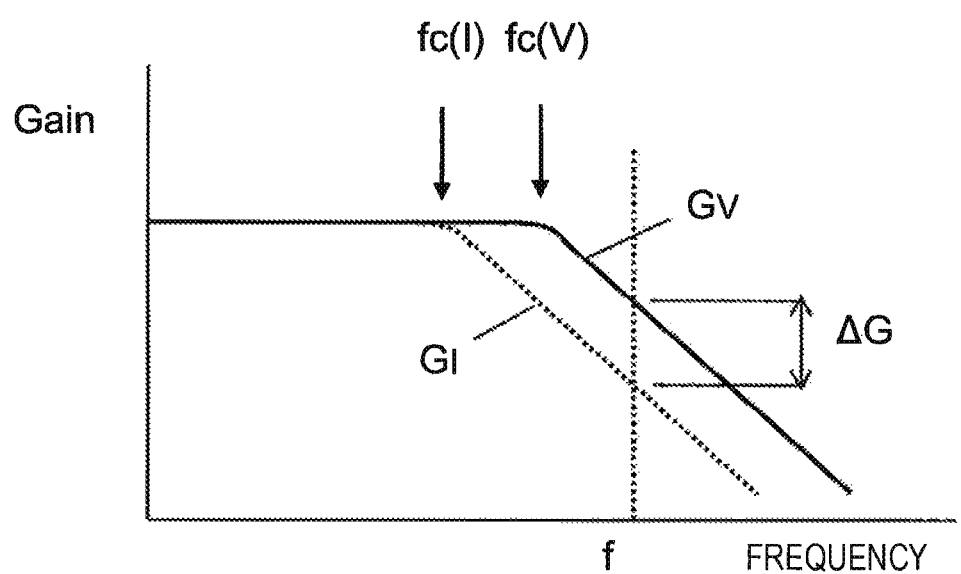
FIG. 12 is a schematic diagram illustrating a transfer function GV of a second voltage measurement unit 22 and a transfer function GI of a current measurement unit 23.

FIG. 12 is a schematic diagram illustrating a transfer function GV of the second voltage measurement unit 22 and a transfer function GI of the current measurement unit 23. In FIG. 12, the horizontal axis denotes a frequency as a logarithmic axis, and the vertical axis denotes a ratio of voltage amplitude as a logarithmic axis. The transfer functions GV and GI illustrated in FIG. 12 have characteristics in that, in a low band (low frequency range), the transfer function has a constant value, but in a high band (high frequency range), the transfer function is decreased as the frequency is increased. This is the low pass characteristic.

In the specification, according to a general regulation, a characteristic frequency fc of a transfer function is defined as a frequency where an amplitude of the transfer function is decreased by 3 dB. The phrase "amplitude of the transfer function is decreased by 3 dB" denotes that "the amplitude of the transfer function becomes $1/\sqrt{2}$". In addition, the characteristic time constant τc is defined by the following Formula (8).

[Mathematical Formula 5]

$$\tau_c = \frac{1}{2\pi f_c} \quad (8)$$

Next, an allowable range as to "the characteristic frequencies are set to be the same as each other" will be described. The case where the transfer function has a first-order low pass characteristic (low-pass filter) will be described. In this case, the transfer function is represented by the following Formula (9). Herein, |G0| denotes a gain in a low frequency range. Namely, G0=G (f→0).

[Mathematical Formula 6]

$$|G(f)| = \frac{|G_0|}{\sqrt{1 + \left(\frac{f}{f_c}\right)^2}} \quad (9)$$

As illustrated in FIG. 12, the characteristic frequency of the transfer function. GV of the second voltage measurement unit 22 is denoted by fc(V), and the characteristic frequency of the transfer function GI of the current :measurement unit 23 is denoted by fc(I).

A gain error ΔG at a frequency f which satisfies f>>fc(V) and f>>fc(V) is represented by the following Formula (10). As understood from Formula (10), the gain is an original gain.

Since |GV0/GI0| multiplied by β is a measurement error, β defined by Formula (11) represents a measurement error caused by a difference between the characteristic frequencies.

[Mathematical Formula 7]

$$\Delta G = \left|\frac{G_V}{G_I}\right| \approx \left|\frac{f_c(V)}{f_c(I)}\right| \times \left|\frac{G_{V0}}{G_{I0}}\right| = \beta \times \left|\frac{G_{V0}}{G_{I0}}\right| \quad (10)$$

$$\beta = \left|\frac{f_c(V)}{f_c(I)}\right| \quad (11)$$

Preferably, in order to set the measurement error to be ±20% or less, as understood from Formula (11), it is preferable that the characteristic frequency of the second voltage measurement unit 22 and the characteristic frequency of the current measurement unit 23 are the same as each other within a range of ±20%. More preferably, in order to set the measurement error to be ±5% or less, as understood from Formula (11), it is preferable that the characteristic frequency of the second voltage measurement unit 22 and the characteristic frequency of the current measurement unit 23 are the same as each other within a range of ±5%.

In the frequency range which is higher than the characteristic frequency of the low pass characteristic, the amplitude of the output signal amplitude is decreased in comparison with the amplitude of the input signal. However, if the characteristic frequencies of the transfer functions of the second voltage measurement unit 22 and the current measurement unit 23 are set to be the same as each other, since β=1 in Formulas (10) and (11), the amplitude ratio of the voltage signal and the current signal becomes a correct value even in h frequency range which is higher than the characteristic frequency. Therefore, it is possible to correctly measure the internal resistance of the battery cells In this manner, if the characteristic frequencies (that is, the characteristic time constants τc) of the transfer functions of the second voltage measurement unit 22 and the current measurement unit 23 are to be the same as each other, even in the case where a measurement circuit having a low characteristic frequency (a long characteristic time constant) is used, there is an effect in that it is possible to accurately obtain the internal resistance.

Sixth Embodiment

A battery monitoring device according to sixth embodiment of the present invention will be described with reference to FIG. 13. In the battery monitoring device 2 according to the sixth embodiment, a voltage detection circuit (digital-analog converter) 22b of a second voltage measurement unit 22 and a current detection circuit (current AD converter) 23b of a current measurement unit 23 are formed on the same integrated circuit (IC) 25. The integrated circuit 25 is configured to include an AD conversion control unit 250 which controls the voltage detection circuit 22b and the current detection circuit 23b. In this manner, if the voltage detection circuit 22b and the current detection circuit 23b are formed on the same integrated circuit 25, the performance of synchronous measurement of the second voltage measurement unit 22 and the current measurement unit 23 can be improved, or the characteristics of the transfer functions can be easily set to be the same as each other.

Figure 13:
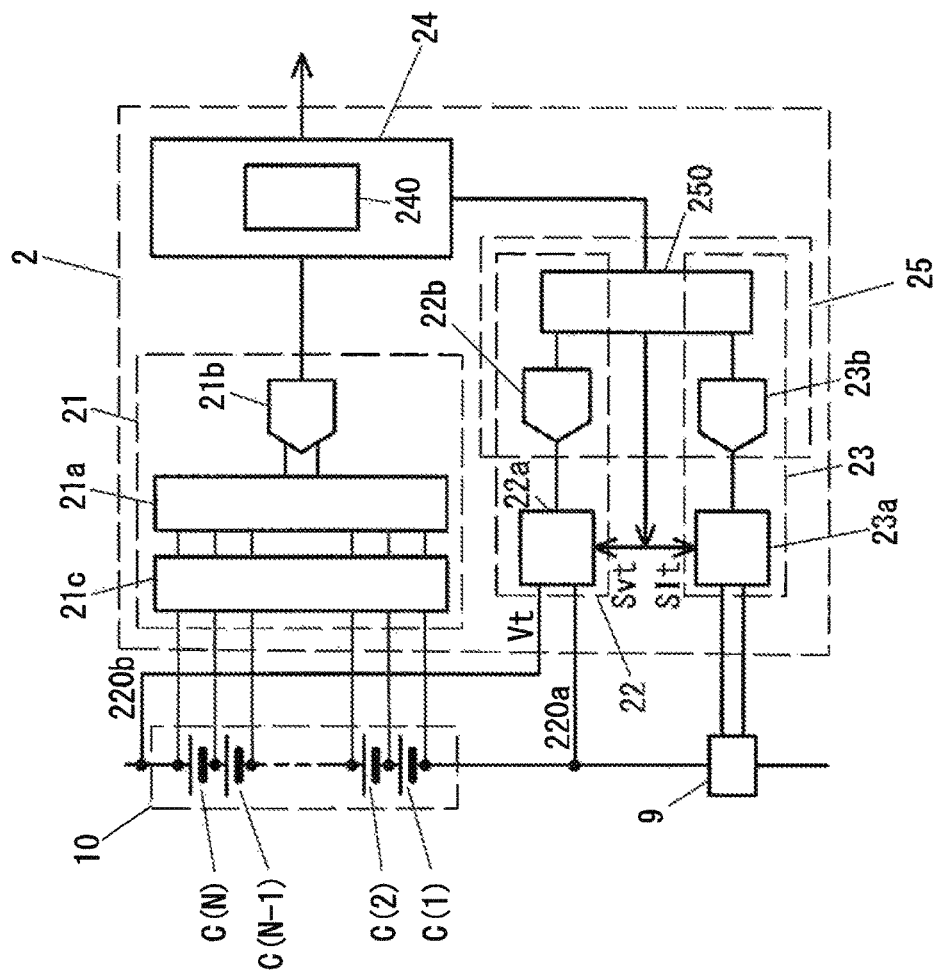
FIG. 13 is a diagram illustrating a battery monitoring device according to a sixth embodiment.

In addition, for simplifying the description, the battery monitoring device 2 illustrated in FIG. 13 is illustrated as a configuration where any one of the N battery cells C(1) to C(N) is selected by a selection circuit 21a provided to the cell voltage measurement unit 21 and a cell voltage of the selected battery cell is measured by a voltage detection circuit 21b. In the embodiment, as illustrated in FIG. 1, the cell voltage measurement unit 21 may be also configured with a plurality of the cell voltage detection circuits CC1 to CCL.

The voltage detection circuit 22b and the current detection circuit 23b receive trigger signals from the AD conversion control unit 250 to start AD conversion. The AD conversion control unit 250 generates the trigger signals so that the conversion timing of the voltage detection circuit 22b and the conversion timing of the current detection circuit 23b are the same as each other. In addition, it is preferable that the voltage detection circuit 22b and the current detection circuit 23b are configured to start the conversion by the same trigger signal.

In addition, it is preferable that a ΔΣ-form AD converter is used for the voltage detection circuit 22b and the current detection circuit 23b. The ΔΣ-form AD converter is preferably used because the AD converter can perform highly-accurate AD conversion.

More preferably, if a decimation filter of the ΔΣ-form AD converter is configured with a decimation filter having the same characteristic as those of the voltage detection circuit 22b and the current detection circuit 23b, the transfer functions of the two AD converters thereof may be configured to be the same as each other.

In addition, as illustrated in FIG. 11, input filters (second voltage input filter 22a and current input filter 23a) may be provided to the second voltage measurement unit 22 and the current measurement unit 23, respectively. In this case, it is more preferable that the characteristic frequency of the second voltage input filter 22a included in the second voltage measurement unit 22 and the characteristic frequency of the current input filter 23a included in the current measurement unit 23 are configured to be the same as each other.

As described above, a battery monitoring device 2 which monitors a battery pack 10 where a plurality of battery cells C(1) to C(N) are connected in series is configured to include a cell voltage measurement unit 21 which measures the voltage between terminals of each of the battery cells C(1) to C(N), a second voltage measurement unit 22 which measures a voltage between two ends of a battery cell group where at least two or more battery cells are connected in series among the battery cells C(1) to C(N), a current measurement unit 23 which measures the current flowing through the battery pack 10, a calculation unit 240 as a cell voltage ratio calculation unit which calculates each cell voltage ratio a (k, t) of the battery cells C(1) to C(N) based on the voltage between the terminals measured by the cell voltage measurement unit 21, a calculation unit 240 as a cell voltage calculation unit which calculates each cell voltage calculation value vc (k, t0) of the battery cells C(1) to C(N) at the time of measuring the voltage between the two ends based on the cell voltage ratio a (k, t) and the voltage between the two ends measured by the second voltage measurement unit 22, and a control unit 24 as a trigger signal generation unit which inputs trigger signals Svt and Sit for acquiring the voltage between the two ends measured by the second voltage measurement unit 22 and the current value measured by the current measurement unit 23 as a set to the second voltage measurement unit 22 and the current measurement unit 23 respectively.

Since the cell voltage calculation value vc (k, t0) of each of the battery cells C(1) to C(N) is calculated based on the cell voltage ratio a (k, t) and the voltage between the two ends measured by the second voltage measurement unit 22, the cell voltage calculation value can be considered to be the cell voltage at the same time point, and thus, the measurement time points of a plurality of the cell voltages and the measurement time point of the current can be synchronized with each other. The trigger signals for acquiring the voltage between the two ends and the current value measured by the current measurement unit 23 as a set denote that the trigger signals are generated so that the cell voltage and the current value required for calculation of the internal resistance are acquired. The measurement time point of the voltage between the two ends and the measurement time point of the current value are controlled so as to be the same or almost the same time points. Therefore, the calculation error of the internal resistance value calculated from the cell voltage calculation value vc (k, t0) and the measured current value can be reduced.

In addition, the trigger signals Svt and Sit for acquiring the voltage between the two ends and the current value as a set are configured as trigger signals by which the input time points are adjusted so that the measurement time point of the second voltage measurement unit 22 and the measurement time point of the current measurement unit 23 are substantially the same as each other, and thus, the internal resistance value can be calculated at a higher accuracy.

In addition, as illustrated in FIG. 9, the number of battery cells in the battery cell group is reduced so as to be smaller than the total number of battery cells in the battery pack 10, and instead of the total voltage Vt (t0), the intermediate voltage Vm(t0) is used, and thus, the magnitude of the voltage value which is to be measured by the second voltage measurement unit 22 becomes small in comparison with the case where the total voltage Vt (t0) is measured. Therefore, for example, the withstand voltage required for the circuit is decreased, so that it is possible to reduce the circuit area of the second voltage measurement unit 22. On the contrary, as illustrated in FIG. 1, by using the total voltage Vt (t0), the load of calculation of the cell voltage calculation value vc(k, t0) can be reduced.

In addition, the battery system 1 of the electric vehicle driving device 100 illustrated in FIG. 1 is configured with the above-described battery monitoring device 2, and thus, the internal resistance of a plurality of the battery cells C(1) to C(N) can be measured for each cell. Therefore, a degree of deterioration of each of the battery cells C(1) to C(N) constituting the battery pack 10 can be measured at a high accuracy. Namely, since the degree of deterioration of the battery can be monitored for each cell, the battery can be controlled at a high accuracy.

The above-described embodiments may be used independently or in a combination manner. This is because the effects of the respective embodiments may be independently or synergistically achieved. In addition, if the features of the present invention are not impaired, the present invention is not limited to any one of the above-described embodiments. For example, although the example of the battery monitoring device provided to the battery system of the electric vehicle driving device is described in the above-described embodiment, the present invention is not limited to the electric vehicle driving device, but it may be applied to a battery monitoring device provided to a battery system of various types of devices.

The disclosure of the following priority application is incorporated herein by reference.

Japanese Patent Application No. 2014-81975 (filed on Apr. 11, 2014)

REFERENCE SIGNS LIST 1 battery system
2 battery monitoring device
9 current measurement element
10 battery pack
21 cell voltage measurement unit
21c cell voltage filter
22 second voltage measurement unit
22a second voltage input filter
22b, 211 voltage detection circuit
23a current input filter
23b current detection circuit
23 current measurement unit
24 control unit
25 integrated circuit
30 vehicle controller 40 inverter
50 rotating electric machine
100 electric vehicle driving device
210 selection circuit.
240 calculation unit
C, C(1) to C(N) battery cell
CC1 to CCL cell voltage measurement circuit
Sit current measurement trigger signal
Svt voltage measurement trigger signal

The invention claimed is:

1. A battery monitoring device which monitors a battery pack where a plurality of battery cells are connected in series, comprising:
a first voltage measurement unit which measures a voltage between terminals of each of the battery cells;
a second voltage measurement unit which measures a voltage of two ends of a battery cell group where at least two or more battery cells are connected in series among the plurality of the battery cells;
a current measurement unit which measures a current flowing through the battery pack;
a cell voltage ratio calculation unit which calculates each cell voltage ratio of the plurality of the battery cell based on the voltage measured by the first voltage measurement unit;
a cell voltage calculation unit which measures each voltage of the plurality of the battery cells at the time of measuring the voltage between the two ends based on the cell voltage ratio and the voltage between the two ends measured by the second voltage measurement unit; and
a trigger signal generation unit which inputs trigger signals for acquiring the voltage between the two ends measured by the second voltage measurement unit and the current value measured by the current measurement unit as a set to the second voltage measurement unit and the current measurement unit, respectively, wherein
the cell voltage ratio is a ratio of an individual cell voltage measurement value to a total sum of all cell voltage measurement values, and
the cell voltage measurement value is equal to the cell voltage ratio multiplied by the total voltage of all of the battery cells constituting the battery pack.

2. The battery monitoring device according to claim 1, wherein the trigger signals for acquiring the voltage between the two ends and the current value as a set are configured as trigger signals by which input time points are adjusted so that a measurement time point of the second voltage measurement unit and a measurement time point of the current measurement unit are substantially the same as each other.

3. The battery monitoring device according to claim 1, wherein the first voltage measurement unit is configured to include a cell voltage filter of which a response time constant is larger than a response time constant of the second voltage measurement unit.

4. The battery monitoring device according to claim 3, wherein the response time constant of the second voltage measurement unit is ½ or less of the response time constant of the cell voltage filter.

5. The battery monitoring device according to claim 1, wherein the first voltage measurement unit is configured to include a cell voltage filter of which a low-band cutoff characteristic time is two or more times a measurement period of the voltage between the terminals.

6. The battery monitoring device according to claim 1, wherein a characteristic time constant of a transfer function of the second voltage measurement unit and a characteristic time constant of a transfer function of the current measurement unit are the same as each other.

7. The battery monitoring device according to claim 6, wherein an analog-digital converter provided to the second voltage measurement unit and an analog-digital converter provided to the current measurement unit are formed on the same integrated circuit.

8. The battery monitoring device according to claim 1, wherein the number of battery cells in the battery cell group is smaller than a total number of battery cells in the battery pack.

9. The battery monitoring device according to claim 1, wherein a current measurement element connected to the current measurement unit is a resistor element.

* * * * *